(12) United States Patent
Hepner et al.

(10) Patent No.: US 7,538,560 B2
(45) Date of Patent: May 26, 2009

(54) SYSTEM AND METHOD FOR COMPONENT FAILURE PROTECTION

(75) Inventors: David Frank Hepner, San Jose, CA (US); Andrew Dale Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 11/683,352

(22) Filed: Mar. 7, 2007

(65) Prior Publication Data

US 2008/0218916 A1     Sep. 11, 2008

(51) Int. Cl.
*G01R 31/08* (2006.01)
(52) U.S. Cl. .................. 324/535; 324/763; 361/56; 361/103; 702/79
(58) Field of Classification Search ................. 324/535; 702/79
See application file for complete search history.

(56) References Cited

U.S. PATENT DOCUMENTS

| | | | |
|---|---|---|---|
| 7,005,871 B1* | 2/2006 | Davies et al. | 324/763 |
| 2007/0058308 A1* | 3/2007 | Thijs et al. | 361/56 |
| 2007/0076342 A1* | 4/2007 | Arndt | 361/103 |
| 2008/0071489 A1* | 3/2008 | Wissel | 702/79 |

* cited by examiner

*Primary Examiner*—Timothy J Dole
*Assistant Examiner*—Benjamin M Baldridge
(74) *Attorney, Agent, or Firm*—Kunzler & McKenzie

(57) ABSTRACT

A system and method is presented for component failure protection. In one embodiment, the system includes an operational circuit configured to operate in a first operational state, wherein the first operational state is in proximity of a circuit failure threshold. Additionally, the system may include a canary circuit configured to mimic the operational characteristics of the operational circuit, wherein the canary circuit is configured to operate in a second operational state, and wherein the second operational state is in closer proximity of a circuit failure threshold than the proximity of the of the first operational state. The system may also include a variable input control coupled to the operational circuit and the canary circuit, wherein the variable input control is configured to monitor the second operational state and adjust an input to the operational circuit based on the proximity of the second operational state to the circuit failure threshold.

4 Claims, 2 Drawing Sheets

SYSTEM AND METHOD FOR COMPONENT FAILURE PROTECTION

BACKGROUND OF THE INVENTION

1. Field of the Invention

This invention relates to electronic circuit protection and more particularly relates to component failure protection.

2. Description of the Related Art

Reducing power consumption in electronic circuitry continues to be a primary design consideration. Another major design consideration is system speed. The power consumption of a system is typically determined by the voltage and associated current requirements of the system. For example, a system that typically requires three Volts to operate may be redesigned to operate at one and a half Volts in order to reduce battery requirements, system weight, thermal output, and other system parameters. The speed of a system is typically determined by the frequency of clocks that drive the system. In an attempt to increase system speeds, the system clock frequencies may be increased.

Unfortunately, current electronic systems have certain physical limitations that often make reduction of power or increase of clock frequency difficult or impossible. Some critical components in electronic systems such as transistors, integrated circuits, and the like may have power or frequency limitations that hinder further improvement. Nonetheless, system designers often design systems to operate in states that run close to these physical limitations. For example, some system designers may reduce the voltage to a circuit or component until the circuit or component fails. Then the voltage is adjusted to a point just above this failure threshold.

In such scenarios, system failure is common. Many external factors typically impact system performance such as power fluctuations at the source, temperature fluctuations, and the like. Since typical circuits are driven right to the boundary of failure, fluctuations in external factors may inadvertently cause a failure in an electronic circuit or component. For example, an increase in temperature may increase the voltage requirements of an electronic component. If the component is operated at such a low voltage that the power supply cannot meet the voltage requirement, the component may fail.

SUMMARY OF THE INVENTION

The present invention has been developed in response to the present state of the art, and in particular, in response to the problems and needs in the art that have not yet been fully solved by currently available circuit protection devices. Accordingly, the present invention has been developed to provide an apparatus, system, and method for component failure protection that overcome many or all of the above-discussed shortcomings in the art.

A system is presented for component failure protection. In one embodiment, the system includes an operational circuit configured to operate in a first operational state, wherein the first operational state is in proximity of a circuit failure threshold. Additionally, the system may include a canary circuit configured to mimic the operational characteristics of the operational circuit, wherein the canary circuit is configured to operate in a second operational state, and wherein the second operational state is in closer proximity of a circuit failure threshold than the proximity of the of the first operational state. The system may also include a variable input control coupled to the operational circuit and the canary circuit, wherein the variable input control is configured to monitor the second operational state and adjust an input to the operational circuit based on the proximity of the second operational state to the circuit failure threshold.

In a further embodiment, the variable input control is further configured to detect a failure of the canary circuit, and adjust the input to the operational circuit in response to detecting the failure of the canary circuit, wherein the input is adjusted to a level that resolves the failure of the canary circuit. The variable input control may detect a failure in the canary circuit by monitoring setup and hold timing of the canary circuit and identifying a violation of one of a predetermined setup time requirement and a predetermined hold time requirement.

A method of the present invention is also presented for component failure protection. The method in the disclosed embodiments substantially includes the steps necessary to carry out the functions presented above with respect to the operation of the described system. In one embodiment, the method includes operating an operational circuit in a first operational state, wherein the first operational state is in proximity of a circuit failure threshold. The method may also include mimicking an operational characteristic of the operational circuit in a canary circuit, wherein the canary circuit is operates in a second operational state, and wherein the second operational state is in closer proximity of a circuit failure threshold than the proximity of the of the first operational state. Additionally the method may include monitoring the second operational state, and adjusting an input to the operational circuit based on the proximity of the second operational state to the circuit failure threshold.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
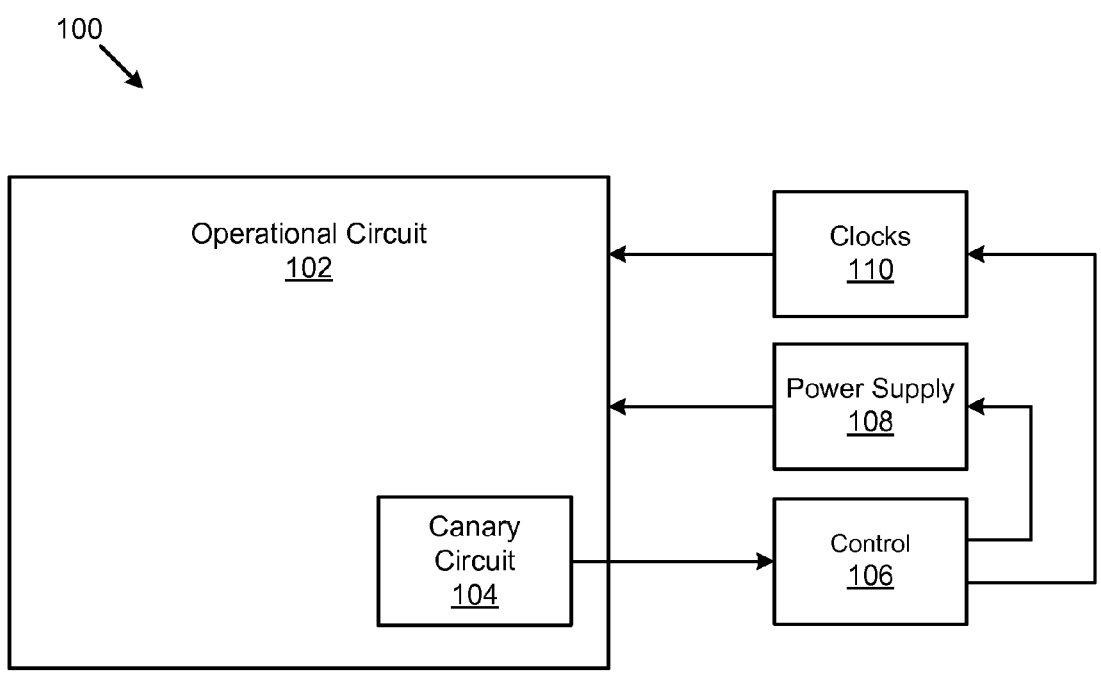
FIG. 1 is a schematic block diagram illustrating one embodiment of a system for component failure protection.

FIG. 1 illustrates one embodiment of a system 100 for component failure protection. In one embodiment, the system includes an operational circuit 102. The operational circuit may have an associated canary circuit 104. The system may also include a variable input control 106, a power supply 108 and a clock source 110. The operational circuit may include the canary circuit 104. Alternatively, the canary circuit 104 may be separated from the operational circuit 102. The variable input control 106 may monitor the canary circuit 104 and adjust the inputs from the power supply 108, clock source 110, and other input sources to the operational circuit 102. In such an embodiment, the operational circuit 102 may be protected from failure by the canary circuit 104 and the variable input control 106.

The operational circuit 102 may be a circuit that is used by a system or user. In one embodiment, the operational circuit 102 may include one or more components that are susceptible to failure. The failure may occur due to low power, high temperature, high frequency or the like. As used herein, the point of failure is referred to as the failure threshold. The failure threshold is the minimum power, or maximum frequency at which the operational circuit 102 or component may operate. The failure threshold may be dependent on a variety of other minimums and maximums such as temperature, vibration, and the like. For example, the operational circuit 102 may include an integrated circuit package, a transistor, a resistor, a capacitor, an inductor, a digital logic gate array, or the like. One or more of the components may be susceptible to failure because of thermal runaway, current runaway, voltage requirements, and the like. For example an integrated circuit package may include a transistor or logic gate that operates at a predetermined voltage threshold. If the voltage on the circuit is too low, the transistor or logic gate may become inoperable. In one particular example, a Bipolar Junction Transistor (BJT) may require at least 0.7 Volts across the emitter-base junction in order operate. If 0.7 Volts is not supplied to the emitter-base junction, the transistor will become inoperable, and the circuit may fail.

One of ordinary skill in the art will recognize that this is merely a simple example for purposes of illustration. Various circuit topologies including a variety of circuit components may be included in the operational circuit 102. In such embodiments, the operational circuit 102 or components therein are operated in an operational state that is in close proximity to the circuit failure threshold. For example, in order to reach close proximity to the circuit failure threshold, the inputs to the operational circuit 102 may be adjusted until the operational circuit 102 fails. Then the inputs may be slightly adjusted until the operational circuit 102 returns to an operational state. Such an operational state would be in close proximity to the circuit failure threshold.

In one embodiment, the canary circuit 104 is configured to mimic the operational circuit 102. For example certain components of the operational circuit 102 that are particularly susceptible to failure may be included in the canary circuit 104. Thus the point of failure of the operational circuit 102 may be mimicked in the canary circuit 104. In an alternative embodiment, the canary circuit 104 may include a duplicate of the operational circuit 102. In such an embodiment, the canary circuit 104 may closely mimic the operational and failure characteristics of the operational circuit 102. In a further embodiment, the canary circuit 104 may receive the same inputs from the power supply 108, the clock source 110, and other input sources for various other input signals to further mimic the operational characteristics of the operational circuit 102. However, the canary circuit 104 may not be operational or useable by a user or system. The canary circuit 104 may be provided for the purpose of predicting and preventing a failure of the operational circuit 102.

In one embodiment, the canary circuit 104 may be slightly modified to operate closer to the failure threshold than the operational circuit 102. In an associated embodiment, canary circuit 104 may be modified in a way that makes the components of the circuit slightly more susceptible to failure. For example, the resistor or capacitor values in the canary circuit 104 may be adjusted to provide voltage levels that are slightly higher or lower to critical components than the levels provided to corresponding components in the operational circuit 102. In a particular embodiment, certain components of the operational circuit 102 may be provided with adjustable counterparts in the canary circuit 104 in order to allow adjustment of the operational characteristics of the canary circuit 104. For example, resistors in the operational circuit 102 may be replaced by potentiometers in the canary circuit 104. Thus the canary circuit 104 may be adjusted to fail before the operational circuit 102 would likely fail.

In one embodiment, the variable input control includes a controller 106. In a further embodiment, the variable input control may include input sources such as a variable power supply 108, a variable rate clock source 110, or the like. The control 106 may include a module configured to monitor the canary circuit 104. For example, the control 106 may monitor the setup and hold times of the canary circuit 104. In such an embodiment, the control 106 may identify a violation of a predetermined setup time requirement or a predetermined hold time requirement. The violation may indicate that the canary circuit 104 has failed, or may fail. The control 106 may trigger the power supply 108 or the clock source 110 to change the input level to the operational circuit 102 in response to a failure or degradation in the performance of the canary circuit 104. In an alternative embodiment, the control 106 may monitor other indicia of failure or degradation of the canary circuit 104. For example, the control 106 may monitor error signals of integrated chip packages within the canary circuit 104, or the like. The control may trigger the input sources 108, 110 to adjust the input levels to the operational circuit 102 by adjusting control signals to the input sources 108, 110.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 2:
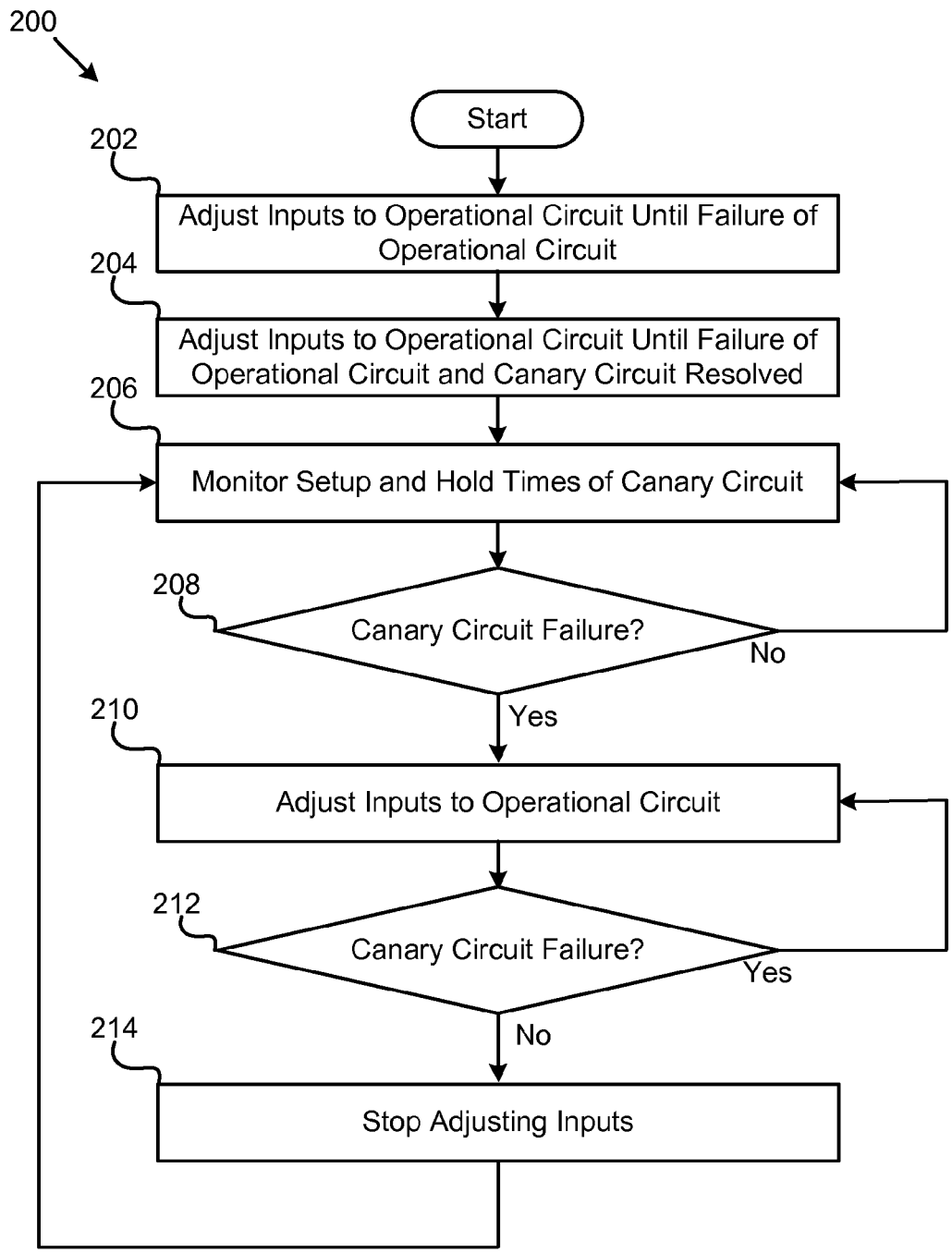
FIG. 2 is a schematic flow chart diagram illustrating one embodiment of a method for component failure protection.

FIG. 2 illustrates one embodiment of a method 200 for component failure protection. The description of the method 200 refers to elements of FIG. 1, like numbers referring to like elements. In one embodiment, the method 200 starts by adjusting 202 the inputs 108, 110 to the operational circuit 102 until the operational circuit 102 fails. The inputs 108, 110 may then be slightly adjusted 204 until the failure of the operational circuit 102 and any failures in the canary circuit 104 are resolved. The variable input control 106 may then monitor 206 the canary circuit 104. For example, the control 106 may monitor 206 the setup and hold times of the canary circuit 104.

If no failure occurs 208, the variable input control 106 continues to monitor 206 the canary circuit 104. However, if the variable input control 106 determines that a failure has occurred 208 in the canary circuit 104, the variable input control 106 may adjust 210 the inputs 108, 110 to the operational circuit 102. If it is determined 212 that the failure continues, the variable input control 106 may continue to adjust 210 the inputs 108, 110 to the operational circuit 102 until it is determined 212 that there is no failure in the canary circuit 104. When it is determined 212 that there is no failure, the variable input control 106 may stop 214 adjusting the inputs 108, 110 to the operational circuit, and continue to monitor 206 the canary circuit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for component failure protection, the system comprising:
   an operational circuit for operating in a first operational state, wherein the first operational state is in proximity of a low voltage circuit failure threshold for a bipolar junction transistor;
   a canary circuit for mimicking the operational characteristics of the operational circuit, wherein the canary circuit operates in a second operational state, and wherein the second operational state is in closer proximity of the low voltage circuit failure threshold for the bipolar junction transistor than the proximity of the first operational state; and
   a variable input control coupled to the operational circuit and the canary circuit, wherein the variable input control monitors the second operational state, detects a failure of the canary circuit by monitoring setup and hold timing of the canary circuit, identifies a violation of one of a predetermined setup time requirement and a predetermined hold time requirement, and increases a power supply voltage input to the operational circuit in response to detecting the failure of the canary circuit, wherein the power supply voltage input is adjusted to a level that resolves the failure of the canary circuit.

2. The system of claim 1, wherein the low voltage circuit failure threshold is 0.7 volts.

3. A method for component failure protection, the method comprising:
   operating an operational circuit in a first operational state, wherein the first operational state is in proximity of a low voltage circuit failure threshold for a bipolar junction transistor;
   mimicking an operational characteristic of the operational circuit in a canary circuit, wherein the canary circuit operates in a second operational state, and wherein the second operational state is in closer proximity of the low voltage circuit failure threshold for the bipolar junction transistor than the proximity of the first operational state;
   monitoring the second operational state, detecting a failure of the canary circuit by monitoring setup and hold timing of the canary circuit and identifying a violation of one of a predetermined setup time requirement and a predetermined hold time requirement; and
   increasing a power supply voltage input to the operational circuit in response to detecting the failure of the canary circuit, wherein the power supply voltage input is adjusted to a level that resolves the failure of the canary circuit.

4. The method of claim 3, wherein the low voltage circuit failure threshold is 0.7 volts.

* * * * *